(12) United States Patent
Kamoshida et al.

(10) Patent No.: US 6,885,598 B2
(45) Date of Patent: Apr. 26, 2005

(54) SHARED SENSE AMPLIFIER SCHEME SEMICONDUCTOR MEMORY DEVICE AND METHOD OF TESTING THE SAME

(75) Inventors: Masahiro Kamoshida, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 10 days.

(21) Appl. No.: 10/679,455

(22) Filed: Oct. 7, 2003

(65) Prior Publication Data

US 2005/0002247 A1 Jan. 6, 2005

(30) Foreign Application Priority Data

Jul. 3, 2003 (JP) ........................................ 2003-191164

(51) Int. Cl.⁷ .............................................. G11C 7/00
(52) U.S. Cl. .................... 365/201; 365/205; 365/207
(58) Field of Search ................................ 365/201, 205, 365/207, 145, 196

(56) References Cited

U.S. PATENT DOCUMENTS 5,903,492 A  5/1999  Takashima ................. 365/145
6,483,737 B2 * 11/2002 Takeuchi et al. ............. 365/145
6,498,743 B2 * 12/2002 Maruyama .................. 365/145
6,657,883 B2 * 12/2003 Takashima .................. 365/145
6,807,084 B1 * 10/2004 Wohlfahrt et al. .......... 365/145

FOREIGN PATENT DOCUMENTS

JP        10-255483        9/1998
JP        2001-67898       3/2001

* cited by examiner

Primary Examiner—Michael S. Lebentritt
Assistant Examiner—Hien Nguyen
(74) Attorney, Agent, or Firm—Oblon, Spivak, McClelland, Maier & Neustadt, P.C.

(57) ABSTRACT

A semiconductor memory device includes first and second select transistors arranged on both sides of a shared-scheme sense amplifier and connected to a bit line, and first and second memory cell arrays connected to the bit line via the first and second select transistors, respectively, the first and second memory cell arrays each including a plurality of memory cells each having a cell transistor and a ferroelectric capacitor. The device further includes a setting circuit which controls the first and second select transistors, thereby setting the first and second memory cell arrays in an operative state at the same time, and a control circuit which performs a test at the same time for the first and second memory cell arrays, which are set in the operative state at the same time by the setting circuit.

18 Claims, 14 Drawing Sheets

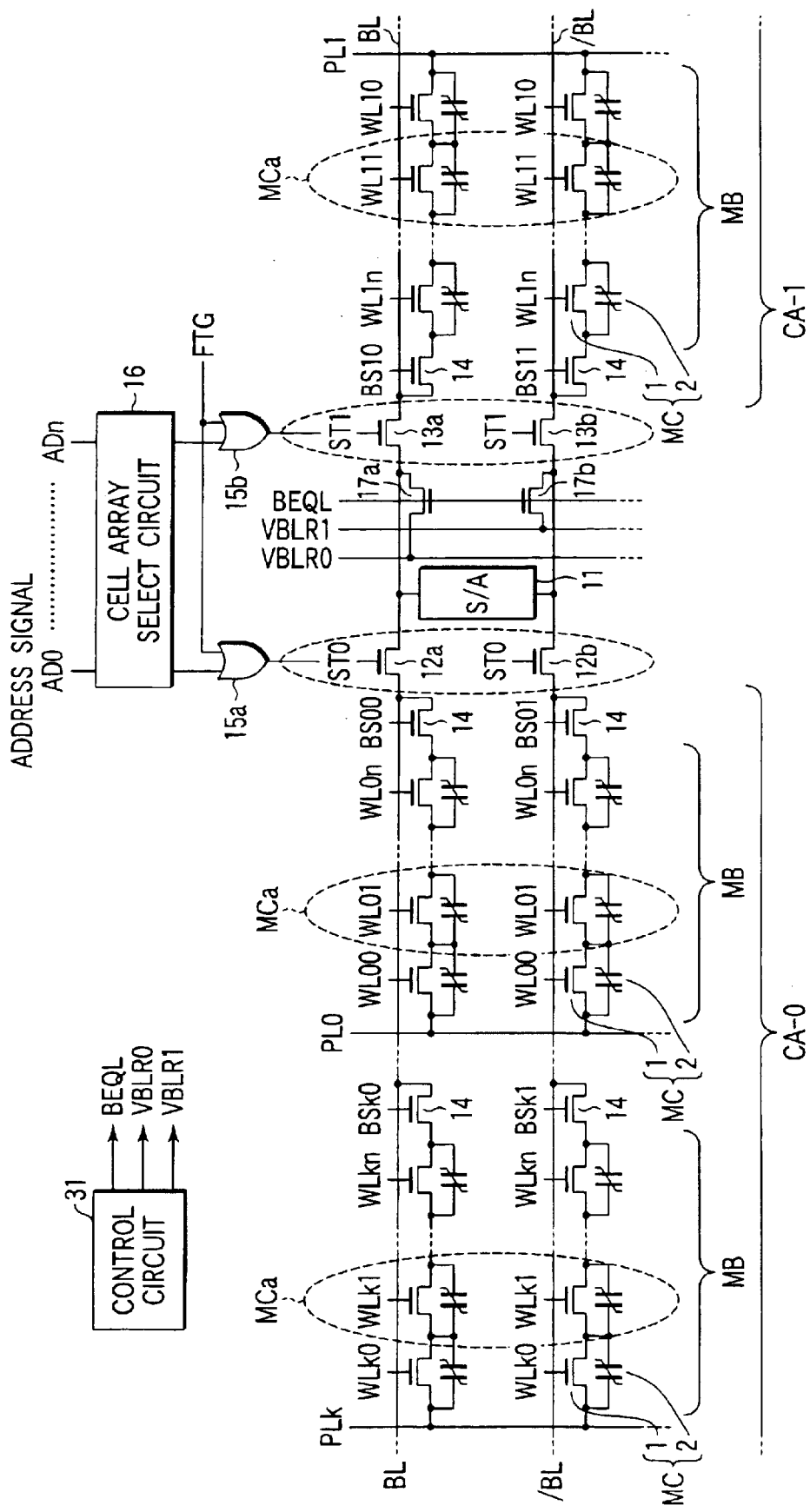
F I G. 1

FIG. 2A  ADx 
FIG. 2B  ST0 (SELECTED) 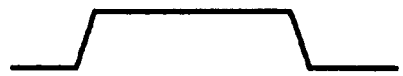
FIG. 2C  ST1 (NON-SELECTED) 
FIG. 3A  ADx 
FIG. 3B  FTG 
FIG. 3C  ST0 (SELECTED) 
FIG. 3D  ST1 (SELECTED) 

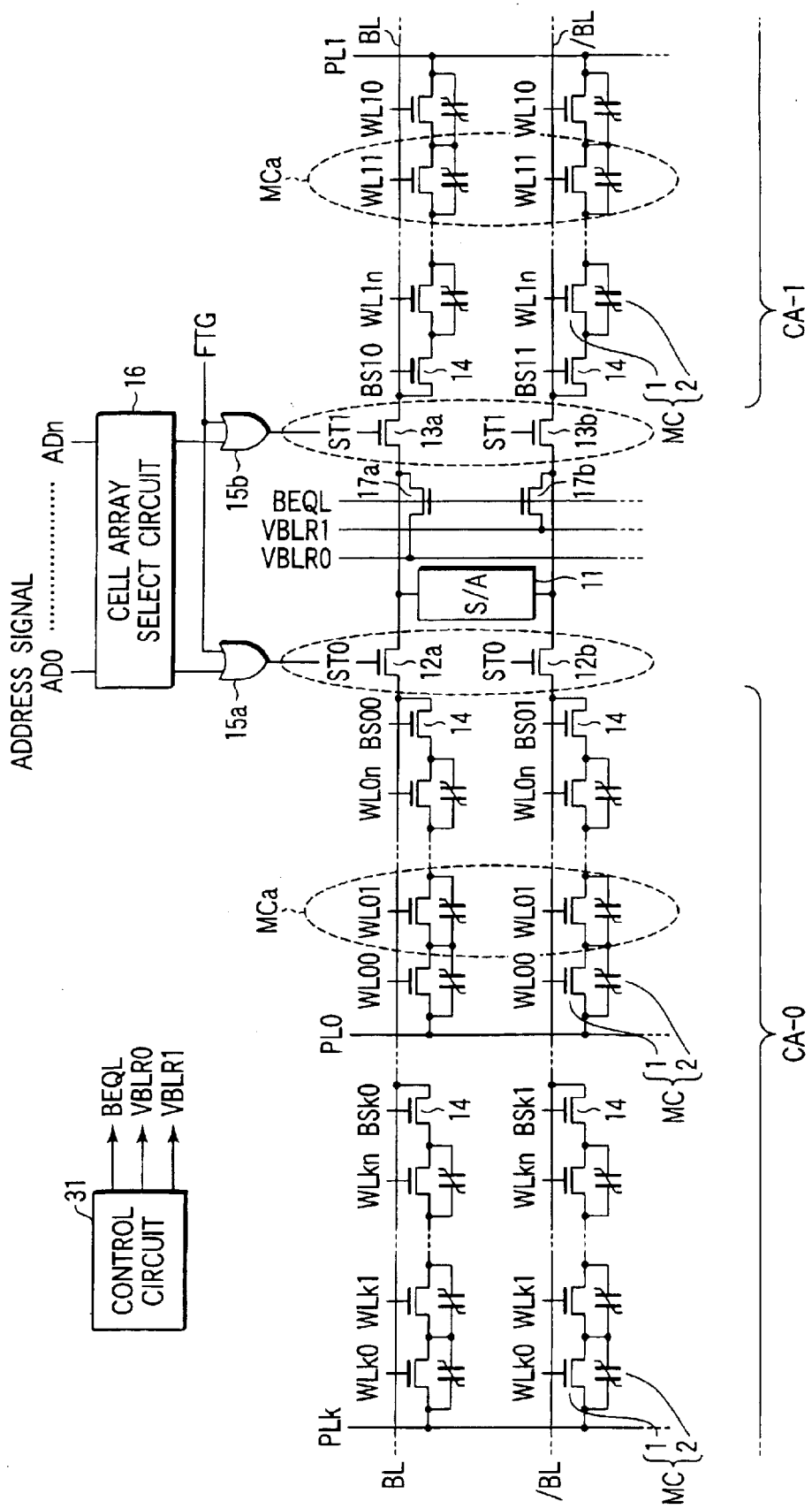
F I G. 4

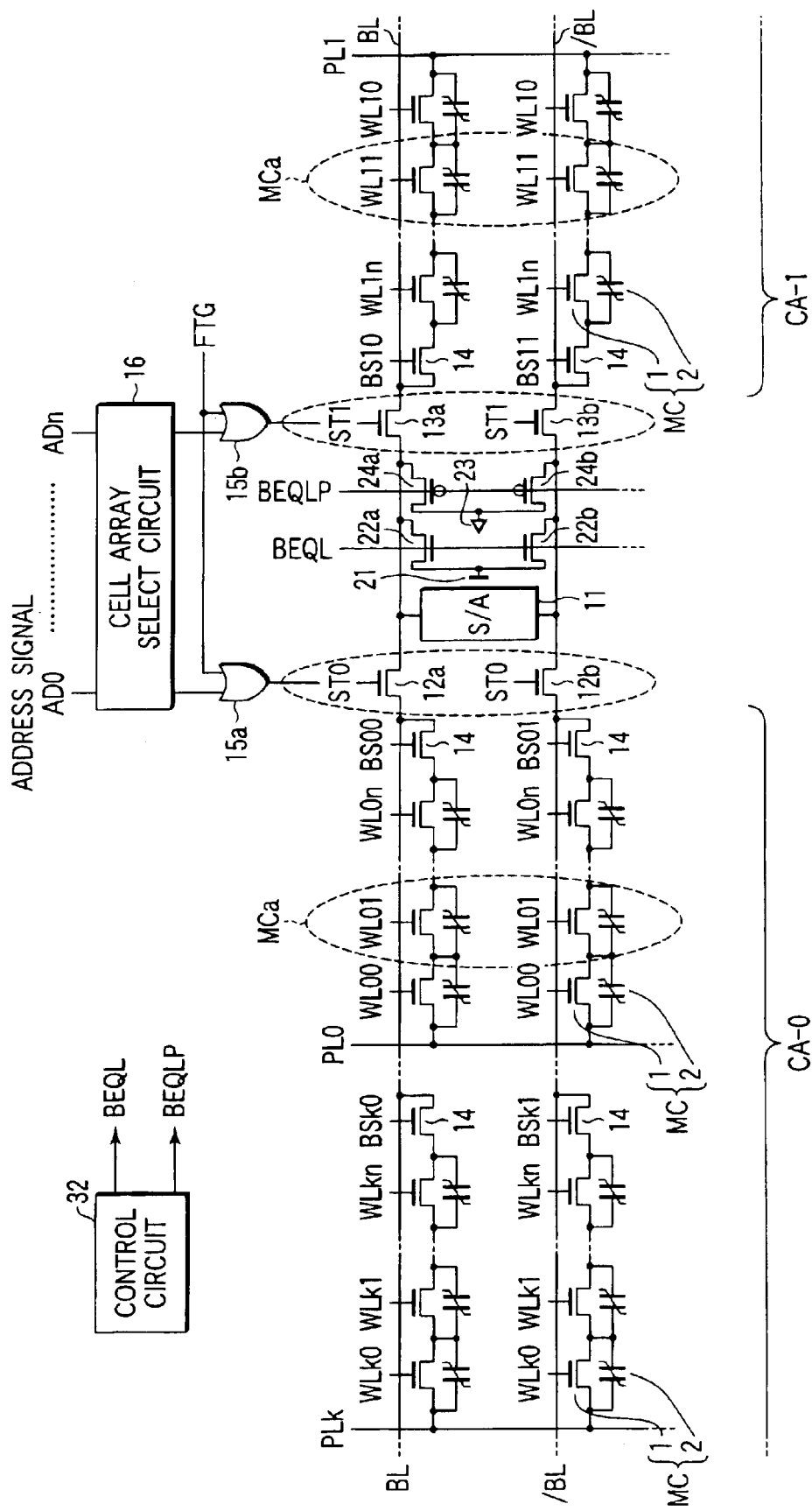
F I G. 6

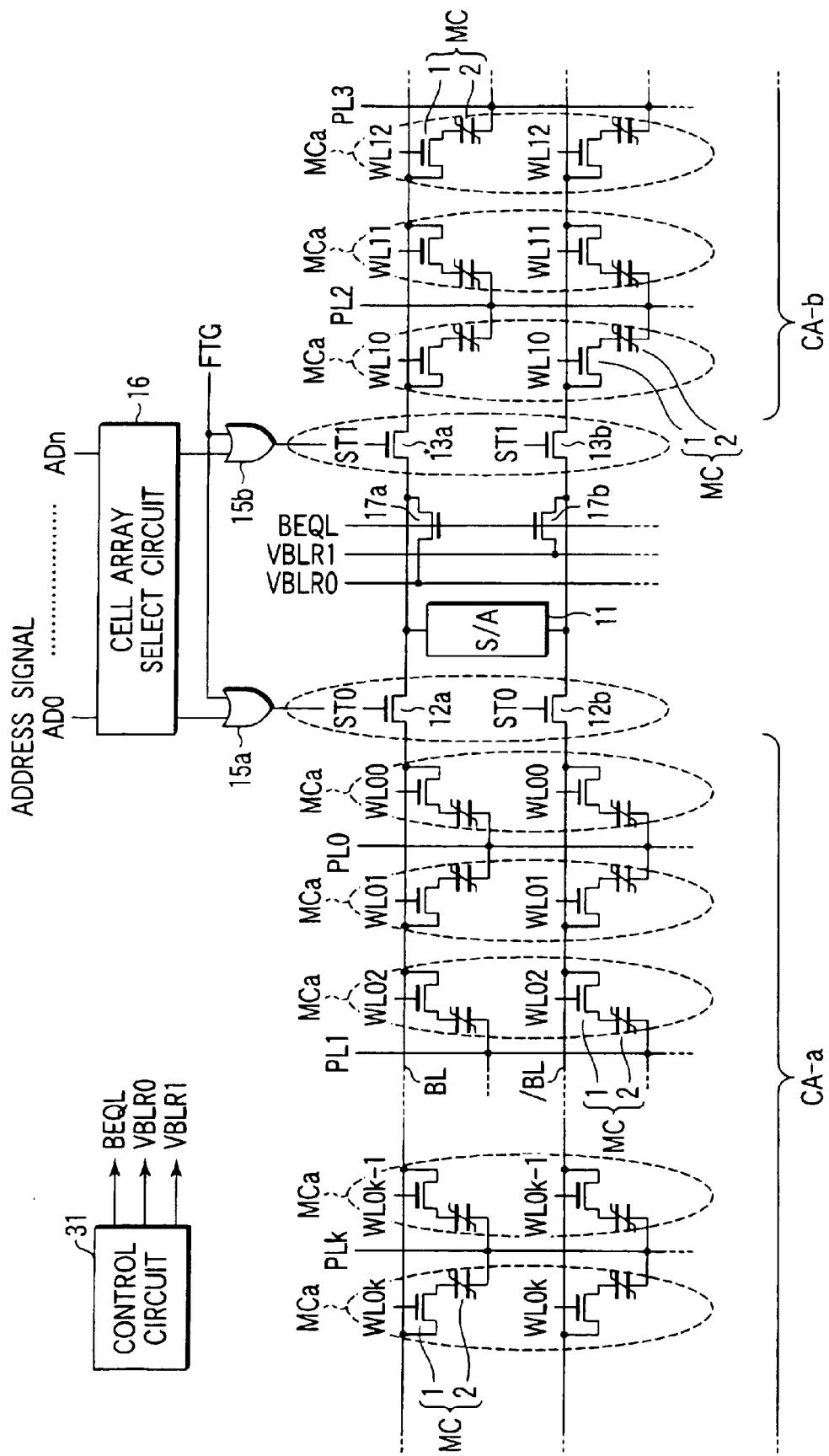
F I G. 7

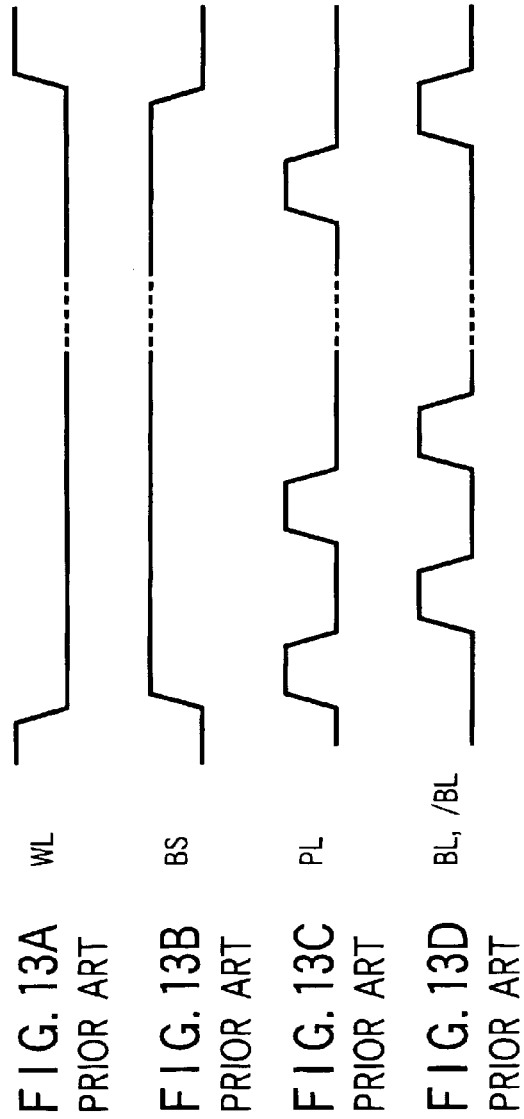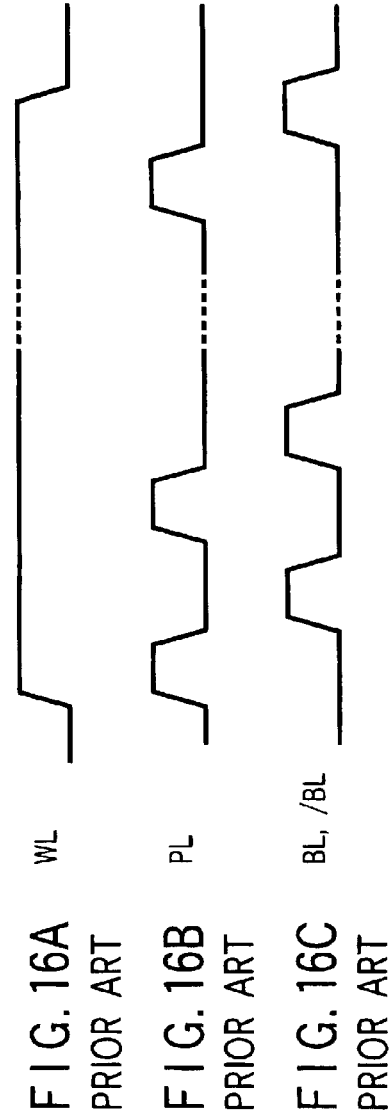

SHARED SENSE AMPLIFIER SCHEME SEMICONDUCTOR MEMORY DEVICE AND METHOD OF TESTING THE SAME

CROSS-REFERENCE TO RELATED APPLICATIONS

This application is based upon and claims the benefit of priority from the prior Japanese Patent Application No. 2003-191164, filed Jul. 3, 2003, the entire contents of which are incorporated herein by reference.

BACKGROUND OF THE INVENTION

1. Field of the Invention

The present invention relates to a semiconductor memory device and a method of testing the same. More specifically, this invention relates to a nonvolatile ferroelectric random access memory (FeRAM) using a ferroelectric capacitor.

2. Description of the Related Art

In these years, attention has been paid to a ferroelectric RAM (FeRAM) using a ferroelectric capacitor as a recent type of memory device (see, e.g. Jpn. Pat. Appln. KOKAI Publication No. 10-255483). The FeRAM is a memory which consists of series connected cell units (memory cells) each having a transistor (T) having a source terminal and a drain terminal and a ferroelectric capacitor (C) inbetween the two terminals, "named series connected TC unit type ferroelectric RAM". The FeRAM has the following advantages. The FeRAM is a nonvolatile memory. The number of data write/erase operations is $10^{12}$. The data read time/write time is substantially equal to that of a DRAM (Dynamic RAM). The FeRAM permits low-voltage operations in a range of 2.5 V to 5 V. By virtue of these features, it is expected that the FeRAM will become the dominant device in all the markets of memories.

FIG. 11 shows an example of the structure of a conventional FeRAM. In this example, the FeRAM uses a shared sense amplifier scheme wherein two cell arrays are connected on both sides of a sense amplifier. As is shown in FIG. 11, each of cell arrays CA-0 and CA-1 comprises a plurality of memory blocks MB. Each memory block MB comprises a plurality of series connected memory cells (cell units) MC, each having a transistor (T) 101 and a ferroelectric capacitor (C) 102 connected in parallel. One terminal of each of the memory blocks MB is connected to a plate line PL (PL0 or PL1 in this example), and the other terminal of each memory block MB is connected to a bit line BL or /BL via an associated one of block select transistors 103. The gate of each block select transistor 103 is connected to a block select signal line BS (one of BS00, BS01, BS10 or BS11 in this example).

The gate of each cell transistor 101 is connected to a word line WL (one of WL00, WL01, . . . ,WL0n, or one of WL10, WL11, . . . ,WL1n in this example). The bit lines BL and /BL are connected to the shared-scheme sense amplifier (S/A) 105 via associated cell array select transistors 104. The gate of each cell array select transistor 104 is connected to a cell array select signal line ST (ST0 or ST1 in this example). The cell array select signal line ST0, ST1, is connected to a cell array select circuit 107.

An (n+1) number of address signal lines ADx (x=0 . . . ,n) are connected to the cell array select circuit 107. In accordance with an address signal supplied via, e.g. the address signal line ADx, the cell array select circuit 107 selects the corresponding one of the cell array select signal lines ST0 and ST1.

Of the bit lines BL and /BL, the bit line BL is connected to the drain of an n-channel metal oxide semiconductor (n MOS) transistor 106a. The source of the nMOS transistor 106a is connected to a signal line VBLR0, and the gate thereof is connected to a signal line BEQL. The bit line /BL is connected to the drain of an nMOS transistor 106b. The source of the nMOS transistor 106b is connected to a signal line VBLR1, and the gate thereof is connected to the signal line BEQL.

In the above structure, for example, as shown in FIG. 12, when memory cells MCa are to be accessed (in a normal access), the potential of the word line WL (WL01) connected to the selected memory cells MCa is set at the low level "L (LOW)". At this time, the potential of the word lines WL other than the word line WL01 remains at the high level "H (HIGH)". In addition, the potential of the corresponding block select signal lines BS (BS00, BS01) is set at the high level "H". At this time, the potential of the block select signal lines BS other than the block select signal lines BS00 and BS01 remains at the low level "L". Further, the cell array select circuit 107 sets the potential of the corresponding cell array select signal line ST (ST0) at the high level "H". At this time, the potential of the cell array select signal line ST other than the cell array select signal line ST0 remains at the low level "L". In this manner, the selected memory cells MCa are accessed.

As described above, in the normal access, in order to prevent damage to data, the potentials of the cell array select signal lines ST0 and ST1 are never set at the high level "H" at the same time. In short, in the conventional FeRAM, simultaneous access to the two cell arrays CA-0 and CA-1 connected to the sense amplifier 105 in a shared scheme is prohibited.

On the other hand, as shown in FIG. 13A, for example, in a fatigue test for detecting a memory cell that is likely to be fatigued, the potential of the word line WL of the memory cell MC to be tested is set at the low level "L". In addition, the cell array select circuit 107 sets the corresponding cell array select signal line ST0 or ST1 (see FIG. 11) at the high level "H". Further, the potentials of all the block select signal lines BS of the selected cell array CA-0 or CA-1 are set at the high level "H" (see FIG. 13B). Besides, the potential of the corresponding plate line PL and the potential of the bit lines BL and /BL are alternately swung (see FIG. 13C and FIG. 13D). In this manner, in the fatigue test, like in the normal access, only one of the two cell arrays CA-0 and CA-1, which are connected to the sense amplifier 105 in the shared scheme, is operated.

FIG. 14 shows another example of the structure of the conventional FeRAM. In this example, the FeRAM uses a shared sense amplifier scheme wherein two cell arrays are connected on both sides of a sense amplifier. As is shown in FIG. 14, each of cell arrays CA-a and CA-b comprises a plurality of memory cells (cell units) MC, each having a transistor (T) 201 and a ferroelectric capacitor (C) 202 connected in series. In the memory cells MC, one terminal of each ferroelectric capacitor 202 is connected to a plate line PL (one of PL0, PL1, PL2 and PL3 in this example), and the other terminal of each ferroelectric capacitor 202 is connected to a bit line BL or /BL via an associated one of cell transistors 201.

The gate of each cell transistor 201 is connected to a word line (one of WL00, WL01, WL02, or one of WL10, WL11, WL12 in this example). The bit lines BL and /BL are connected to the shared-scheme sense amplifier (S/A) 205 via associated cell array select transistors 204. The gate of each cell array select transistor 204 is connected to a cell array select signal line ST (ST0 or ST1 in this example). The cell array select signal line ST0, ST1, is connected to a cell array select circuit 207.

An (n+1) number of address signal lines ADx (x=0, . . . ,n) are connected to the cell array select circuit 207. In accordance with an address signal supplied via, e.g. the address signal line ADx, the cell array select circuit 207 selects the corresponding one of the cell array select signal lines ST0 and ST1.

Of the bit lines BL and /BL, the bit line BL is connected to the drain of an nMOS transistor 206a. The source of the nMOS transistor 206a is connected to a signal line VBLR0, and the gate thereof is connected to a signal line BEQL. The bit line /BL is connected to the drain of an nMOS transistor 206b. The source of the nMOS transistor 206b is connected to a signal line VBLR1, and the gate thereof is connected to the signal line BEQL.

In the above structure, for example, as shown in FIG. 15, when memory cells MCb are to be accessed (in the normal access), the potential of the word line WL (WL01) connected to the selected memory cells MCb is set at the high level "H". The potential of the word line WL connected to the non-selected memory cells is set at the low level "L". Further, the cell array select circuit 207 sets the potential of the corresponding cell array select signal line ST (ST0) at the high level "H". Thereby, the selected memory cells MCb are accessed.

As described above, in the normal access time, in order to prevent damage to data, the potentials of the cell array select signal lines ST0 and ST1 are never set at the high level "H" at the same time. In short, in the conventional FeRAM having this structure, too, simultaneous access to the two cell arrays CA-a and CA-b connected to the sense amplifier 205 in the sharing scheme is prohibited.

On the other hand, as shown in FIG. 16A, for example, in a fatigue test, the potential of the word line WL of the memory cell MC to be tested is set at the high level "H". In addition, the cell array select circuit 207 sets the corresponding cell array select signal line ST0 or ST1 (see FIG. 14) at the high level "H". Further, the potential of the corresponding plate line PL and the potential of the bit lines BL and /BL are alternately swung (see FIG. 16B and FIG. 16C). In this FeRAM, in the fatigue test, like in the normal access, only one of the two cell arrays CA-a and CA-b, which are connected to the sense amplifier 205 in the shared scheme, is operated.

As has been described above, in the conventional FeRAM using the shared sense amplifier scheme, only one of the two cell arrays, which are connected to the sense amplifier in the shared scheme, is operated in the fatigue test, too. Consequently, the two cell arrays need to be tested individually, and this leads to an increase in test time.

BRIEF SUMMARY OF THE INVENTION

According to a first aspect of the present invention, there is provided a semiconductor memory device comprising: a shared-scheme sense amplifier; a bit line connected to the sense amplifier; first and second select transistors arranged on both sides of the sense amplifier and connected to the bit line; a first memory cell array connected to the bit line via the first select transistor, the first memory cell array including a plurality of memory cells each having a cell transistor and a ferroelectric capacitor; a second memory cell array connected to the bit line via the second select transistor, the second memory cell array including a plurality of memory cells each having a cell transistor and a ferroelectric capacitor; a setting circuit which controls the first and second select transistors, thereby setting the first and second memory cell arrays in an operative state at the same time; and a control circuit which performs a test at the same time for the first and second memory cell arrays, which are set in the operative state at the same time by the setting circuit.

According to a second aspect of the present invention, there is provided a method of testing a semiconductor memory device including: first and second select transistors arranged on both sides of a shared-scheme sense amplifier and connected to bit line; a first memory cell array connected to the bit line via the first select transistor, the first memory cell array including a plurality of memory cells each having a cell transistor and a ferroelectric capacitor; a second memory cell array connected to the bit line via the second select transistor, the second memory cell array including a plurality of memory cells each having a cell transistor and a ferroelectric capacitor, the method comprising: controlling the first and second select transistors by a setting circuit, thereby setting the first and second memory cell arrays in an operative state at the same time; and performing a test at the same time, by a control circuit, for the first and second memory cell arrays, which are set in the operative state at the same time by the setting circuit.

BRIEF DESCRIPTION OF THE SEVERAL VIEWS OF THE DRAWING

FIG. 1 is a circuit diagram for explaining the structure and operation of a ferroelectric RAM (FeRAM) according to a first embodiment of the present invention;

FIG. 2A to FIG. 2C are signal waveform diagrams for explaining a cell array select operation in a normal access in the FeRAM shown in FIG. 1;

FIG. 3A to FIG. 3D are signal waveform diagrams for explaining a cell array select operation in a fatigue test in the FeRAM shown in FIG. 1;

FIG. 4 is a circuit diagram for explaining the operation in a fatigue test in the FeRAM shown in FIG. 1;

FIG. 6 is a circuit diagram for explaining the operation in a fatigue test in the FeRAM shown in FIG. 5;

FIG. 7 is a circuit diagram for explaining the structure and operation of an FeRAM according to a third embodiment of the present invention;

FIG. 13A to FIG. 13D are signal waveform diagrams for explaining the operation in a fatigue test in the FeRAM shown in FIG. 11;

FIGS. 16A to 16C are signal waveform diagrams for explaining the operation in a fatigue test in the FeRAM shown in FIG. 14.

DETAILED DESCRIPTION OF THE INVENTION

Figure 5:
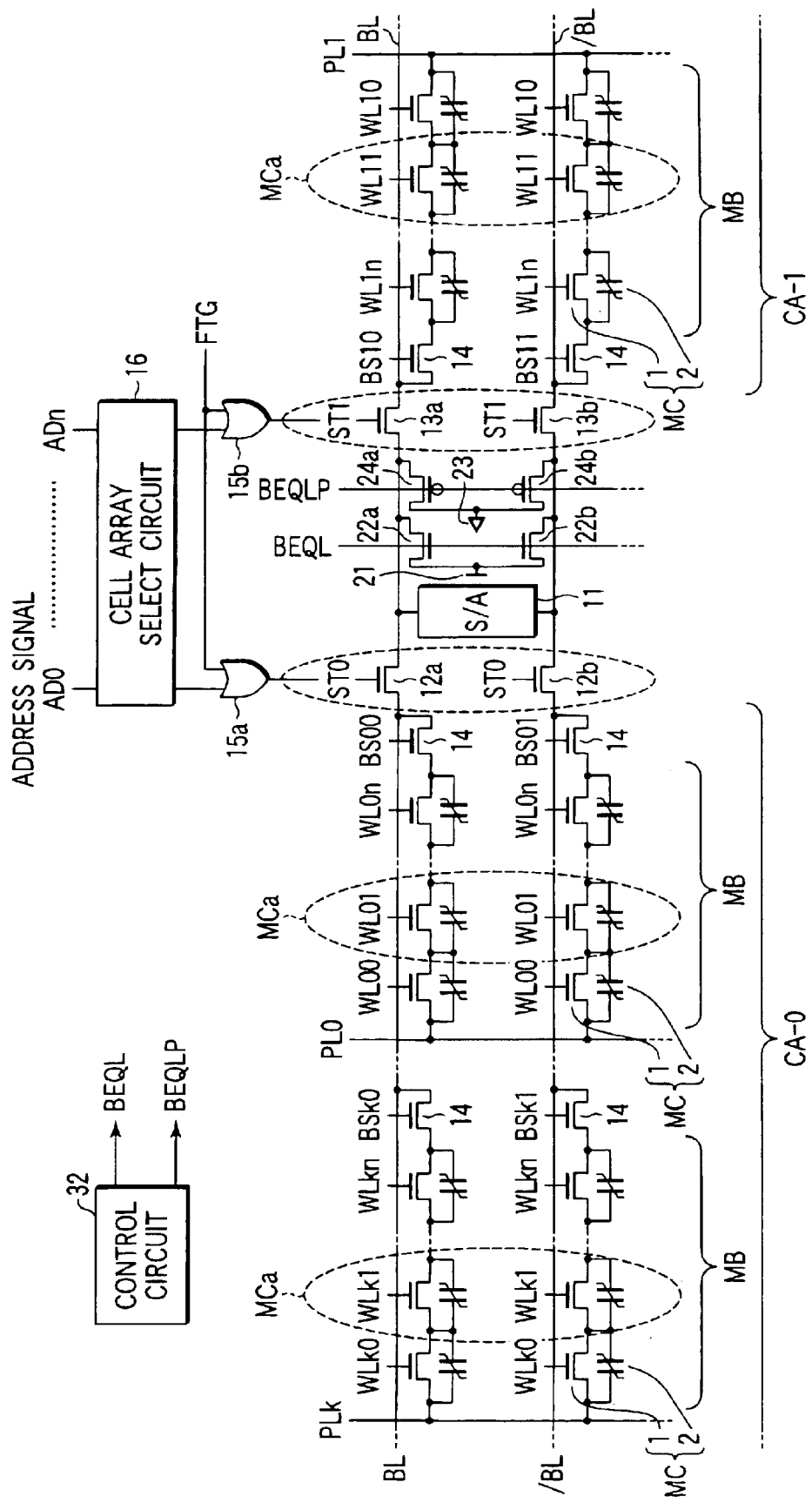
FIG. 5 is a circuit diagram for explaining the structure and operation of an FeRAM according to a second embodiment of the present invention.

Embodiments of the present invention will now be described with reference to the accompanying drawings.
(First Embodiment)

FIG. 1 shows an example of the structure of a ferroelectric RAM (FeRAM) according to a first embodiment of the present invention. This FeRAM uses a shared sense amplifier scheme, wherein two cell arrays CA-0 and CA-1 are connected to a sense amplifier 11 in a sharing manner. A pair of complementary signal lines, that is, bit lines BL and /BL, are connected to the shared-scheme sense amplifier 11. The cell array CA-0 is connected to the bit lines BL and /BL via cell array select transistors 12a and 12b. In addition, the cell array CA-1 is connected to the bit lines BL and /BL via cell array select transistors 13a and 13b. The cell array CA-0 and CA-1 are arranged on both sides of the sense amplifier 11 (shared sense amplifier scheme).

Each of the cell arrays CA-0 and CA-1 comprises a plurality of memory blocks MB. Each memory block MB includes a plurality of series connected memory cells (cell units) MC each having a cell transistor (T) 1 and a ferroelectric capacitor (C) 2 connected in parallel. One terminal of each of the memory blocks MB is connected to an associated one of plate lines, PLm (m=0, . . . ,k), and the other terminal thereof is connected to the bit line BL or /BL via an associated one of block select transistors 14. The gate of each block select transistor 14 is connected to an associated block select signal line BS (one of BS00, . . . ,BSk0, BS01, . . . ,BSk1, BS10, . . . and BS11, . . . in this example).

The gate of each cell transistor 1 is connected to an associated word line WL (one of WL00 to WL0$n$, WLk0 to WLk$n$, and WL10 to WL1$n$ in this example). The gate of each of the cell array select transistors 12a and 12b is connected to a cell array select signal line ST0, and the gate of each of the cell array select transistors 13a and 13b is connected to a cell array select signal line ST1. The cell array select signal lines ST0 and ST1 are connected to output terminals of OR gates 15a and 15b, respectively. One input terminal of each of the OR gates 15a and 15b is connected to a cell array select circuit 16.

An (n+1) number of address signal lines ADx (x=0, . . . ,n) are connected to the cell array select circuit 16. In accordance with an address signal supplied via, e.g. the address signal line ADx, the cell array select circuit 16 selects the corresponding one of the cell array select signal lines ST0 and ST1 (in a normal access). In the normal access, as shown in FIG. 2A, for example, the potential of at least one of the address signal lines ADx is set at the high level "H" for a predetermined time period. Then, the cell array select circuit 16 sets the potential of the cell array select signal line ST0 at the high level "H" and also sets the potential of the cell array select signal line ST1 at the low level "L" via the OR gates 15a and 15b (see FIGS. 2B and 2C). Alternatively, the cell array select circuit 16 sets the potential of the cell array select signal line ST0 at the low level "L" and sets the potential of the cell array select signal line ST1 at the high level "H".

In FIG. 1, the other input terminal of each of the OR gates 15a and 15b is supplied with a test control signal FTG indicating a fatigue test. While the test control signal FTG is at the high level "H", that is, during the fatigue test, the potentials of both cell array select signal lines ST0 and ST1 are set at the high level "H", as shown in FIGS. 3A to 3D, for example. Thereby, in the fatigue test, both the cell arrays CA-0 and CA-1 are rendered operative at the same time.

While the test control signal FTG is at the low level "L", either (or both) of the cell array select signal lines ST0 and ST1 is set at the low level "L". In short, in the normal access, as described above, only one of the cell arrays CA-0 and CA-1 is rendered operative.

As is shown in FIG. 1, of the bit lines BL and /BL, the bit line BL is connected to the drain of an nMOS (Metal Oxide Semiconductor) transistor 17a. The source of the NMOS transistor 17a is connected to a signal line VBLR0, and the gate thereof is connected to a signal line BEQL. The bit line /BL is connected to the drain of an nMOS transistor 17b. The source of the nMOS transistor 17b is connected to a signal line VBLR1, and the gate thereof is connected to the signal line BEQL. The signal lines BEQL, VBLR0 and VBLR1 are controlled by a control circuit 31.

In the above structure, in the fatigue test (e.g. test of memory cells MCa), the potential of the corresponding word line WL01, WLk1, WL11, . . . , is set at the low level "L". The potentials of all the block select signal lines BS00, BS01, BSk0, BSk1, BS10, BS11, . . . , are set at the high level "H". Further, the test control signal FTG is set at the high level "H" and the potentials of both cell array select signal lines ST0 and ST1, which are outputs from the OR gates 15a and 15b, are set at the high level "H". Thus, the two cell arrays CA-0 and CA-1, which are connected to the sense amplifier 11 in the shared scheme, are operated at the same time. The potential difference between the ferroelectric capacitors 2 in the two simultaneously operating cell arrays CA-0 and CA-1 is controlled. Specifically, the potential of the plate line, PL0, PL1, . . . ,PLk, and the potential of the bit lines BL and /BL are alternately swung.

In this embodiment, for example, the control circuit 31 controls the signal line BEQL and renders the nMOS transistors 17a and 17b conductive. In addition, pulse signals from the outside of the device are applied to the sources of the nMOS transistors 17a and 17b via the signal lines VBLR0 and VBLR1. Thereby, the potentials of the bit lines BL and /BL are controlled.

In this manner, the potentials of the bit lines BL and /BL and the potential of the plate line PLm (m=0, . . . ,k) are alternately changed. Thereby, when the fatigue test is conducted, a desired test can be performed at the same time for the two simultaneously operating cell arrays CA-0 and CA-1.

According to the present embodiment, only in the fatigue test, the two cell arrays CA-0 and CA-1, which are connected to the sense amplifier 11 in the shared scheme, can be operated at the same time. As a result, the test time needed for the fatigue test can be halved while damage to data in the normal access can be prevented.

In the above-described embodiment, the potential of the plate line PLm (m=0, . . . ,k) and the potentials of the bit lines BL and /BL are alternately swung, thereby carrying out the desired test. Additionally, as shown in FIG. 4, the fatigue test can also be performed by performing an operation similar to an ordinary read operation in the state in which the two cell arrays CA-0 and CA-1 connected to the sense amplifier 11 in the shared scheme are operated at the same time. Specifically, the test control signal FTG is set at the high level "H" and the potentials of both cell array select signal lines ST0 and ST1, which are outputs from the OR gates 15a and 15b, are set at the high level "H". In addition, the potential of the word line WL01, WL11 associated with the selected memory cells MCa is set at the low level "L".

Further, the potential of only the associated block select signal line, BS00, BS01, BS10, BS11, is set at the high level "H". Thereby, the FeRAM is made to carry out the operation similar to the ordinary read operation in the state in which the cell arrays CA-0 and CA-1 are operated at the same time.

As has been described above, in the FeRAM with the structure shown in FIG. 1, the desired test can be conducted at the same time for the two simultaneously operating cell arrays CA-0 and CA-1. Moreover, by causing the FeRAM to perform the operation similar to the ordinary read operation, the fatigue test with a reduced test time can be carried out.

(Second Embodiment)

FIG. 5 shows an example of the structure of a ferroelectric RAM (FeRAM) according to a second embodiment of the present invention. The second embodiment is configured such that in a fatigue test the bit line potentials are swung by using nMOS transistors connected to a power supply potential and pMOS transistors connected to a ground potential. The parts common to those in FIG. 1 are denoted by the same reference numerals, and a detailed description thereof is omitted.

In this embodiment, nMOS transistors 22a and 22b and pMOS transistors 24a and 24b, instead of the aforementioned nMOS transistors 17a and 17b, are connected to the bit lines BL and /BL. The gates of the nMOS transistors 22a and 22b are commonly connected to the signal line BEQL. The drain of the nMOS transistor 22a is connected to the bit line BL, and the drain of the nMOS transistor 22b is connected to the bit line /BL. The sources of the nMOS transistors 22a and 22b are connected to a power supply potential 21. Similarly, the gates of the pMOS transistors 24a and 24b are commonly connected to a signal line BEQLP. The drain of the pMOS transistor 24a is connected to the bit line BL, and the drain of the pMOS transistor 24b is connected to the bit line /BL. The sources of the pMOS transistors 24a and 24b are connected to a ground potential 23. The signal lines BEQL and BEQLP are controlled by a control circuit 32.

In the above structure, when the fatigue test (e.g. test of memory cell MCa) is conducted, the test control signal FTG is set at the high level "H" and the potentials of both cell array select signal lines ST0 and ST1, which are outputs from the OR gates 15a and 15b, are set at the high level "H". Further, the word line WL01, WLk1, WL11, . . . , which corresponds to the memory cells MCa to be tested, is set at the low level "L", and all the block select signal lines BS00, BS01, BSk0, BSk1, BS10, BS11, . . . , are set at the high level "H". Thus, the two cell arrays CA-0 and CA-1, which are connected to the sense amplifier 11 in a shared scheme, are operated at the same time. In addition, the potential of the plate line, PL0, PL1, . . . ,PLk, and the potentials of the bit lines BL and /BL in the two simultaneously operating cell arrays CA-0 and CA-1 are alternately swung.

In this embodiment, for example, the control circuit 32 controls the signal lines BEQL and BEQLP and alternately turns on and off the nMOS transistors 22a and 22b and the pMOS transistors 24a and 24b. In addition, when the NMOS transistors 22a and 22b are turned on, the potentials of the bit lines BL and /BL are raised to the power supply potential 21. When the pMOS transistors 24a and 24b are turned on, the potentials of the bit lines BL and /BL are lowered to the ground potential 23. Thereby, the potentials of the bit lines BL and /BL are controlled.

In this manner, the potentials of the bit lines BL and /BL and the potential of the plate line PLm (m=0, . . . ,k) are alternately changed. Thereby, when the fatigue test is conducted, a desired test can be performed at a time for the two simultaneously operating cell arrays CA-0 and CA-1.

With this structure, like in the first embodiment, the test time needed for the fatigue test can be halved while damage to data in the normal access can be prevented.

In the above-described second embodiment, the potential of the plate line PLm (m=0, . . . ,k) and the potentials of the bit lines BL and /BL are alternately swung, thereby carrying out the desired test. Additionally, as shown in FIG. 6, the fatigue test can also be conducted by performing an operation similar to an ordinary read operation in the state in which the two cell arrays CA-0 and CA-1 connected to the sense amplifier 11 in the shared scheme are operated at the same time. Specifically, the test control signal FTG is set at the high level "H" and the potentials of both cell array select signal lines ST0 and ST1, which are outputs from the OR gates 15a and 15b, are set at the high level "H". In addition, the potential of the word line WL01, WL11 associated with the selected memory cells MCa is set at the low level "L". Further, the potential of only the associated block select signal line, BS00, BS01, BS10, BS11, is set at the high level "H". Thereby, the FeRAM is made to carry out the operation similar to the ordinary read operation in the state in which the cell arrays CA-0 and CA-1 are operated at the same time.

As has been described above, in the FeRAM with the structure shown in FIG. 5, the desired test can be conducted at the same time for the two simultaneously operating cell arrays CA-0 and CA-1. Moreover, by causing the FeRAM to perform the operation similar to the ordinary read operation, the fatigue test with a reduced test time can be carried out.

(Third Embodiment)

FIG. 7 shows an example of the structure of a ferroelectric RAM (FeRAM) according to a third embodiment of the present invention. This FeRAM is configured such that each of the cell arrays connected in the shared scheme comprises a plurality of memory cells (cell units) each having a cell transistor and a ferroelectric capacitor connected in series. The parts common to those in FIG. 1 are denoted by the same reference numerals, and a detailed description thereof is omitted.

In this embodiment, a pair of complementary signal lines, that is, bit lines BL and /BL, are connected to the shared-scheme sense amplifier (S/A) 11. The cell array CA-a is connected to the bit lines BL and /BL via cell array select transistors 12a and 12b. In addition, the cell array CA-b is connected to the bit lines BL and /BL via cell array select transistors 13a and 13b. The cell array CA-a and CA-b are arranged on both sides of the sense amplifier 11 (shared sense amplifier scheme).

Each of the cell arrays CA-a and CA-b comprises a plurality of memory cells (cell units) MC each having a cell transistor (T) 1 and a ferroelectric capacitor (C) 2 connected in series. One terminal of the ferroelectric capacitor 2 in each memory cell MC is connected to an associated one of plate lines, PLm (m=0, . . . ,k), and the other terminal thereof is connected to the bit line BL or /BL via the cell transistor 1.

The gate of each cell transistor 1 is connected to an associated word line WL (one of WL00 to WL0k, and WL10, . . . , in this example). The gate of each of the cell array select transistors 12a and 12b is connected to a cell array select signal line ST0, and the gate of each of the cell array select transistors 13a and 13b is connected to a cell array select signal line ST1. The cell array select signal lines ST0 and ST1 are connected to output terminals of OR gates 15a and 15b, respectively. One input terminal of each of the OR gates 15a and 15b is connected to a cell array select circuit 16. The other input terminal of each of the OR gates 15a and 15b is supplied with a test control signal FTG.

In the above structure, during the fatigue test (e.g. test of memory cells MCa), the potentials of all the word lines WL00 to WL0k, and WL10, . . . , are set at the high level "H". Further, the test control signal FTG is set at the high level "H" and the potentials of both cell array select signal lines ST0 and ST1, which are outputs from the OR gates 15a and 15b, are set at the high level "H". Thus, the two cell arrays CA-a and CA-b, which are connected to the sense amplifier 11 in the shared scheme, are operated at the same time. Then, the potential of the plate line, PL0, PL1, PL3, . . . ,PLk, and the potentials of the bit lines BL and /BL in the two simultaneously operating cell arrays CA-a and CA-b are alternately swung.

In this embodiment, for example, the control circuit 31 controls the signal line BEQL and renders the nMOS transistors 17a and 17b conductive. In addition, pulse signals from the outside of the device are applied to the sources of the nMOS transistors 17a and 17b via the signal lines VBLR0 and VBLR1. Thereby, the potentials of the bit lines BL and /BL are controlled.

In this manner, the potentials of the bit lines BL and /BL and the potential of the plate line PLm (m=0, . . . ,k) are alternately changed. Thereby, when the fatigue test is conducted, a desired test can be performed at the same time for the two simultaneously operating cell arrays CA-a and CA-b.

According to the present embodiment, only during the fatigue test, the two cell arrays CA-a and CA-b, which are connected to the sense amplifier 11 in the shared scheme, can be operated at the same time. As a result, the test time needed for the fatigue test can be halved while damage to data in the normal access can be prevented.

Figure 8:
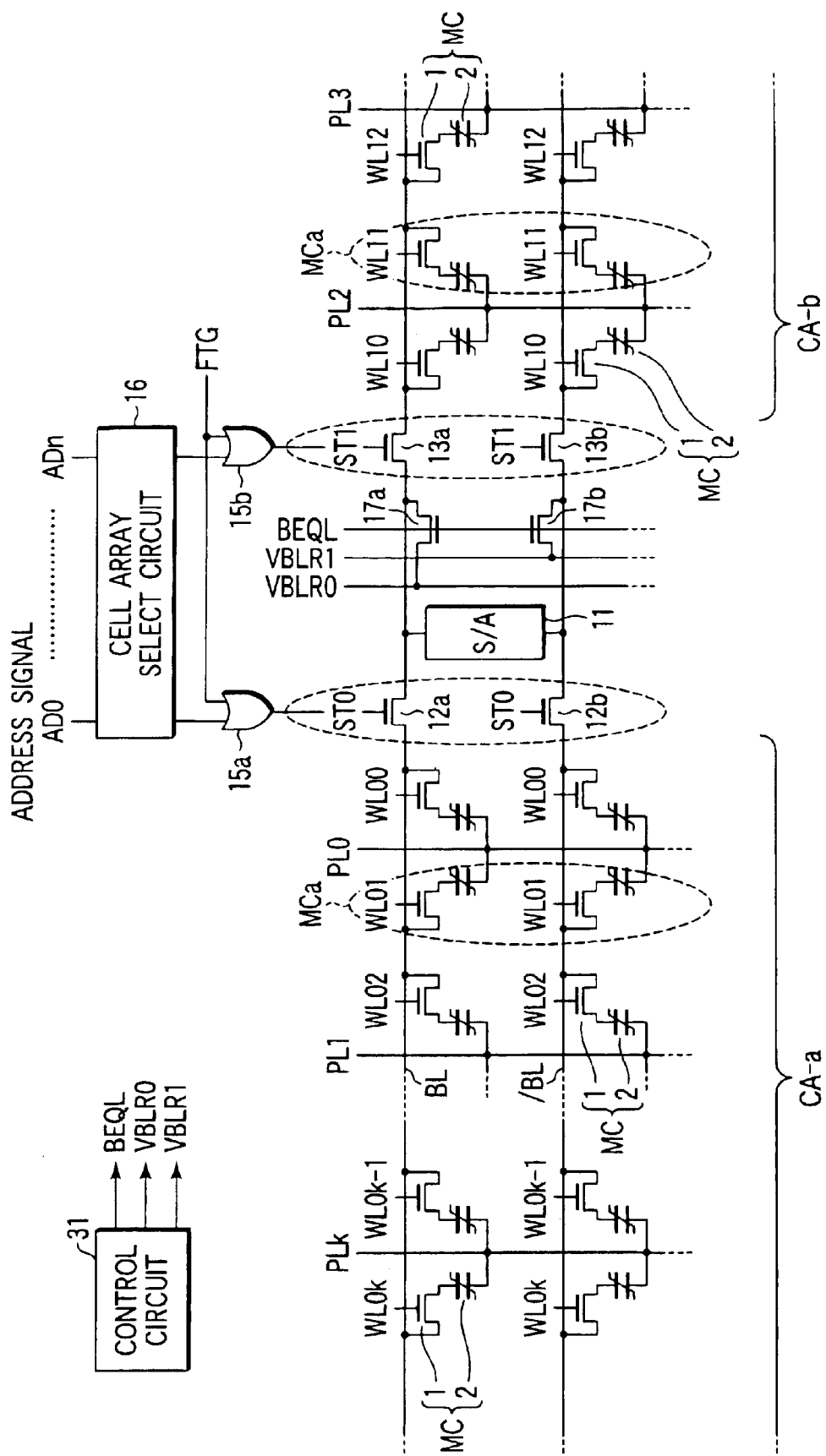
FIG. 8 is a circuit diagram for explaining the operation in a fatigue test in the FeRAM shown in FIG. 7.

In the above-described third embodiment, the potential of the plate line PLm (m=0, . . . ,k) and the potentials of the bit lines BL and /BL are alternately swung, thereby carrying out the desired test. Additionally, as shown in FIG. 8, the fatigue test can also be conducted by performing an operation similar to an ordinary read operation in the state in which the two cell arrays CA-a and CA-b connected to the sense amplifier 11 in the shared scheme are operated at the same time. Specifically, the test control signal FTG is set at the high level "H" and the potentials of both cell array select signal lines ST0 and ST1, which are outputs from the OR gates 15a and 15b, are set at the high level "H". In addition, the potential of the word line WL01, WL11 associated with the selected memory cells MCa is set at the high level "H". Thereby, the FeRAM is made to carry out the operation similar to the ordinary read operation in the state in which the cell arrays CA-a and CA-b are operated at the same time.

As has been described above, in the FeRAM with the structure shown in FIG. 7, the desired test can be conducted at the same time for the two simultaneously operating cell arrays CA-a and CA-b. Moreover, by causing the FeRAM to perform the operation similar to the ordinary read operation, the fatigue test with a reduced test time can be carried out.

(Fourth Embodiment)

Figure 9:
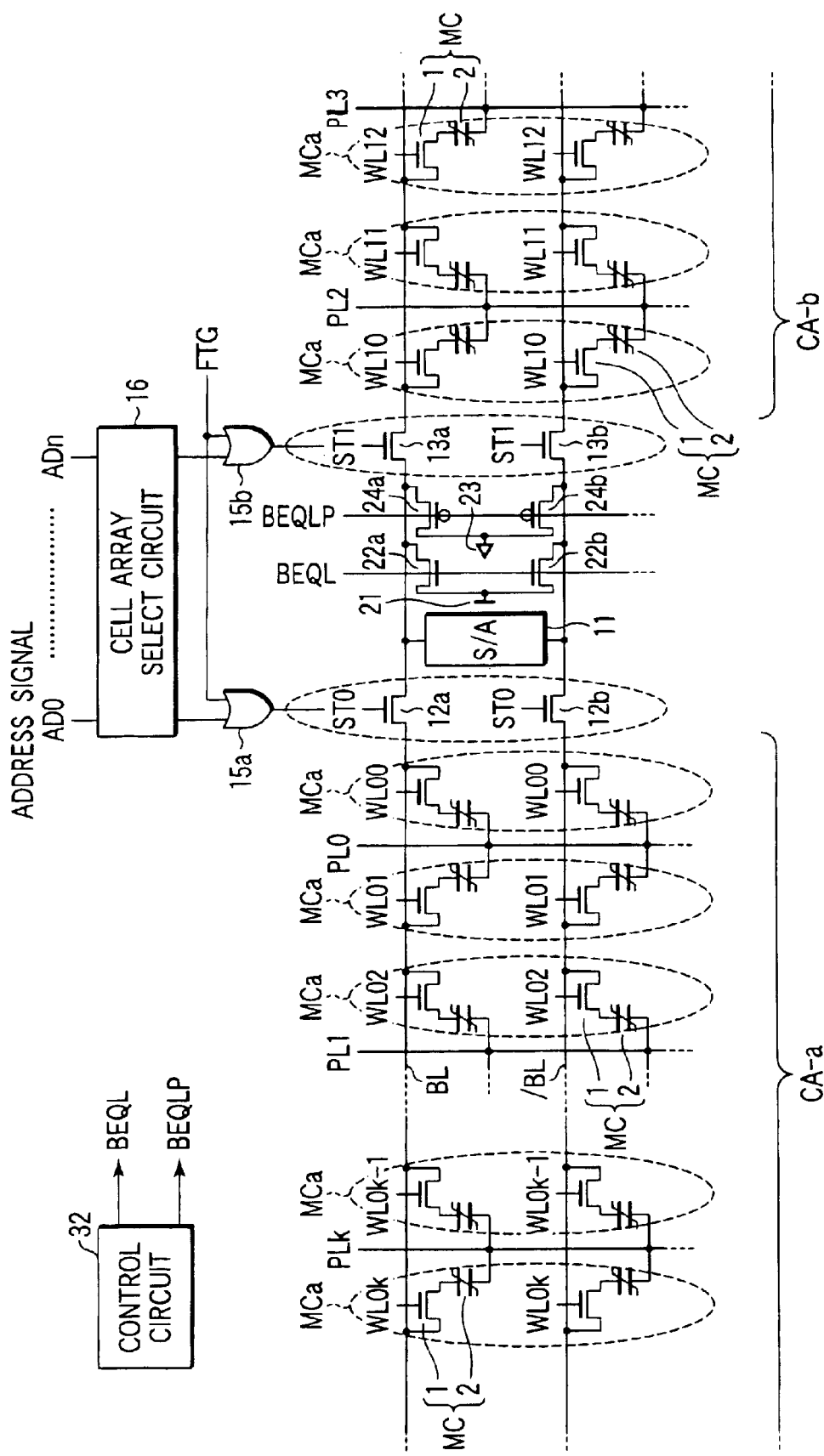
FIG. 9 is a circuit diagram for explaining the structure and operation of an FeRAM according to a fourth embodiment of the present invention.

FIG. 9 shows an example of the structure of a ferroelectric RAM (FeRAM) according to a forth embodiment of the present invention. The fourth embodiment is configured such that in the fatigue test the bit line potentials are swung by using nMOS transistors connected to a power supply potential and pMOS transistors connected to a ground potential. The parts common to those in FIG. 7 are denoted by the same reference numerals, and a detailed description thereof is omitted.

In this embodiment, nMOS transistors 22a and 22b and pMOS transistors 24a and 24b, instead of the aforementioned nMOS transistors 17a and 17b, are connected to the bit lines BL and /BL. The gates of the NMOS transistors 22a and 22b are commonly connected to the signal line BEQL. The drain of the nMOS transistor 22a is connected to the bit line BL, and the drain of the nMOS transistor 22b is connected to the bit line /BL. The sources of the nMOS transistors 22a and 22b are connected to a power supply potential 21. Similarly, the gates of the pMOS transistors 24a and 24b are commonly connected to a signal line BEQLP. The drain of the pMOS transistor 24a is connected to the bit line BL, and the drain of the pMOS transistor 24b is connected to the bit line /BL. The sources of the pMOS transistors 24a and 24b are connected to a ground potential 23. The signal lines BEQL and BEQLP are controlled by a control circuit 32.

In the above structure, when the fatigue test (e.g. test of memory cells MCa) is conducted, the test control signal FTG is set at the high level "H" and the potentials of both cell array select signal lines ST0 and ST1, which are outputs from the OR gates 15a and 15b, are set at the high level "H". Further, the potentials of all the word lines WL00 to WL0k, WL10, . . . , are set at the high level "H". Thus, the two cell arrays CA-a and CA-b, which are connected to the sense amplifier 11 in the shared scheme, are operated at the same time. In addition, in the two simultaneously operating cell arrays CA-a and CA-b, the potential of the plate line, PL0, PL1, . . . ,PLk, and the potentials of the bit lines BL and /BL are alternately swung.

In this embodiment, for example, the control circuit 32 controls the signal lines BEQL and BEQLP and alternately turns on and off the nMOS transistors 22a and 22b and the pMOS transistors 24a and 24b. In addition, when the nMOS transistors 22a and 22b are turned on, the potentials of the bit lines BL and /BL are raised to the power supply potential 21. When the PMOS transistors 24a and 24b are turned on, the potentials of the bit lines BL and /BL are lowered to the ground potential 23. Thereby, the potentials of the bit lines BL and /BL are controlled.

In this manner, the potentials of the bit lines BL and /BL and the potential of the plate line PLm (m=0, . . . ,k) are alternately changed. Thereby, when the fatigue test is conducted, a desired test can be performed at the same time for the two simultaneously operating cell arrays CA-a and CA-b.

With this structure, like the third embodiment, the test time needed for the fatigue test can be halved while damage to data in the normal access can be prevented.

Figure 10:
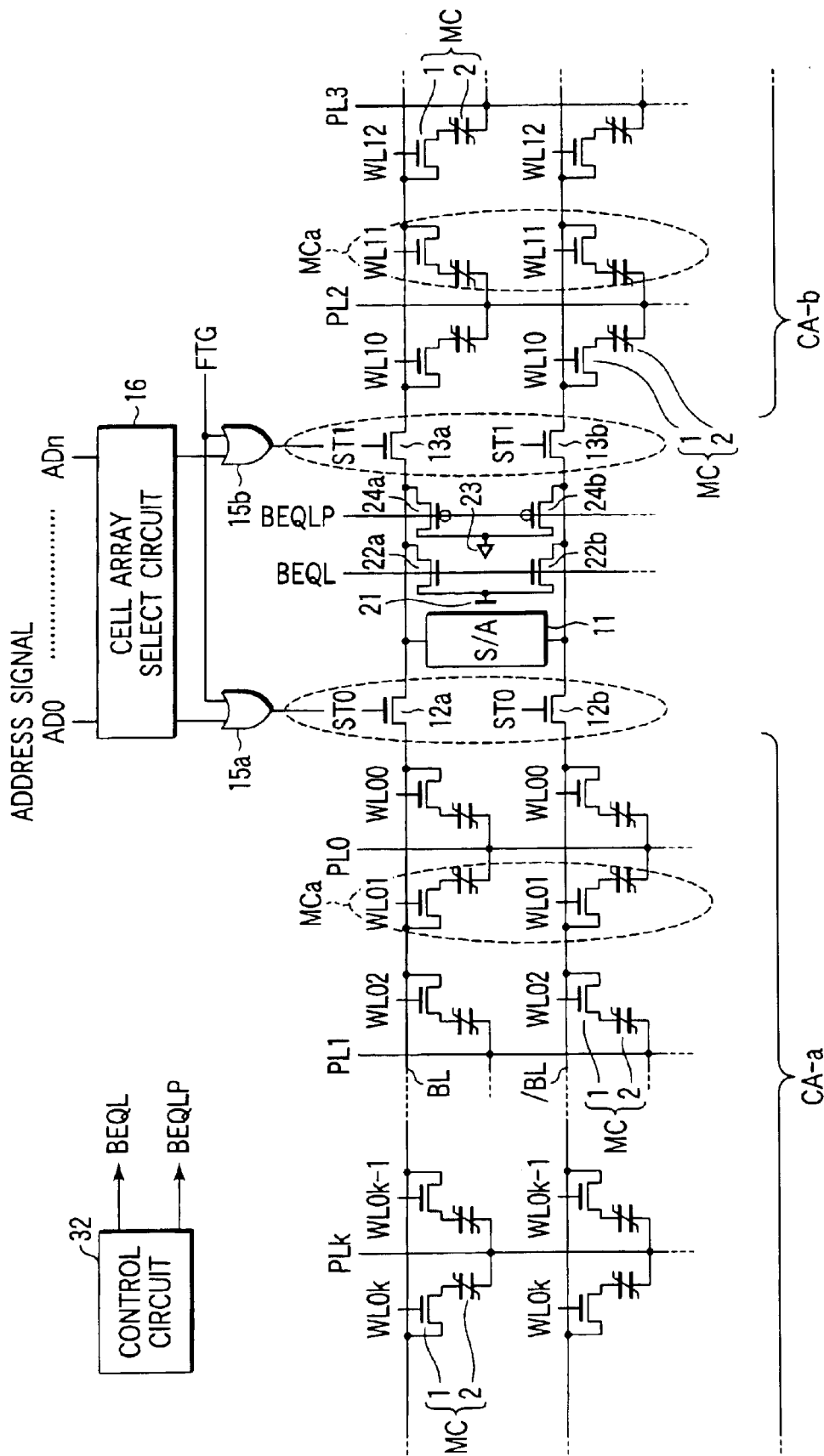
FIG. 10 is a circuit diagram for explaining the operation in a fatigue test in the FeRAM shown in FIG. 9.
Figure 11:
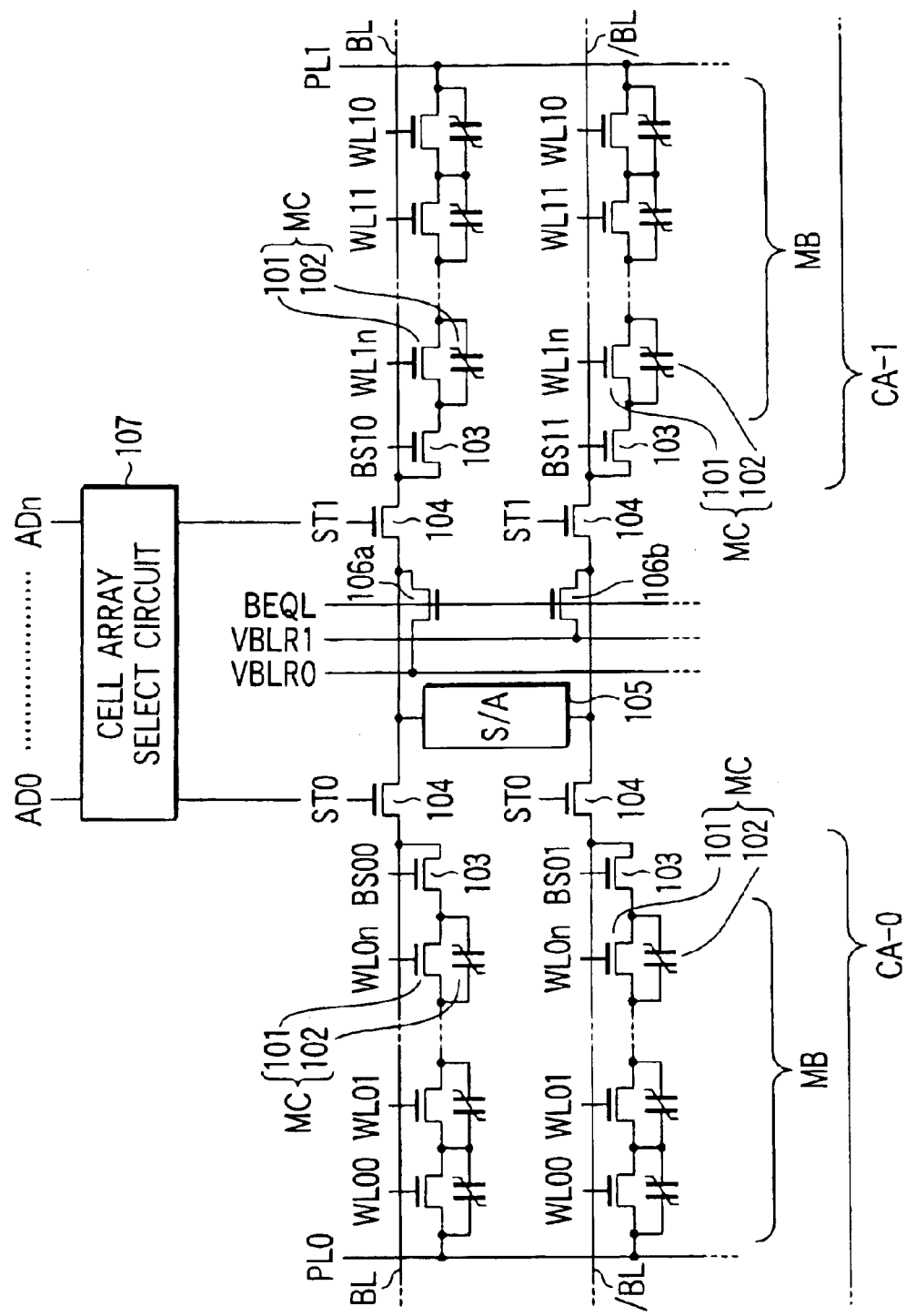
FIG. 11 is a circuit configuration diagram of an FeRAM for explaining the prior art and its problems.
Figure 12:
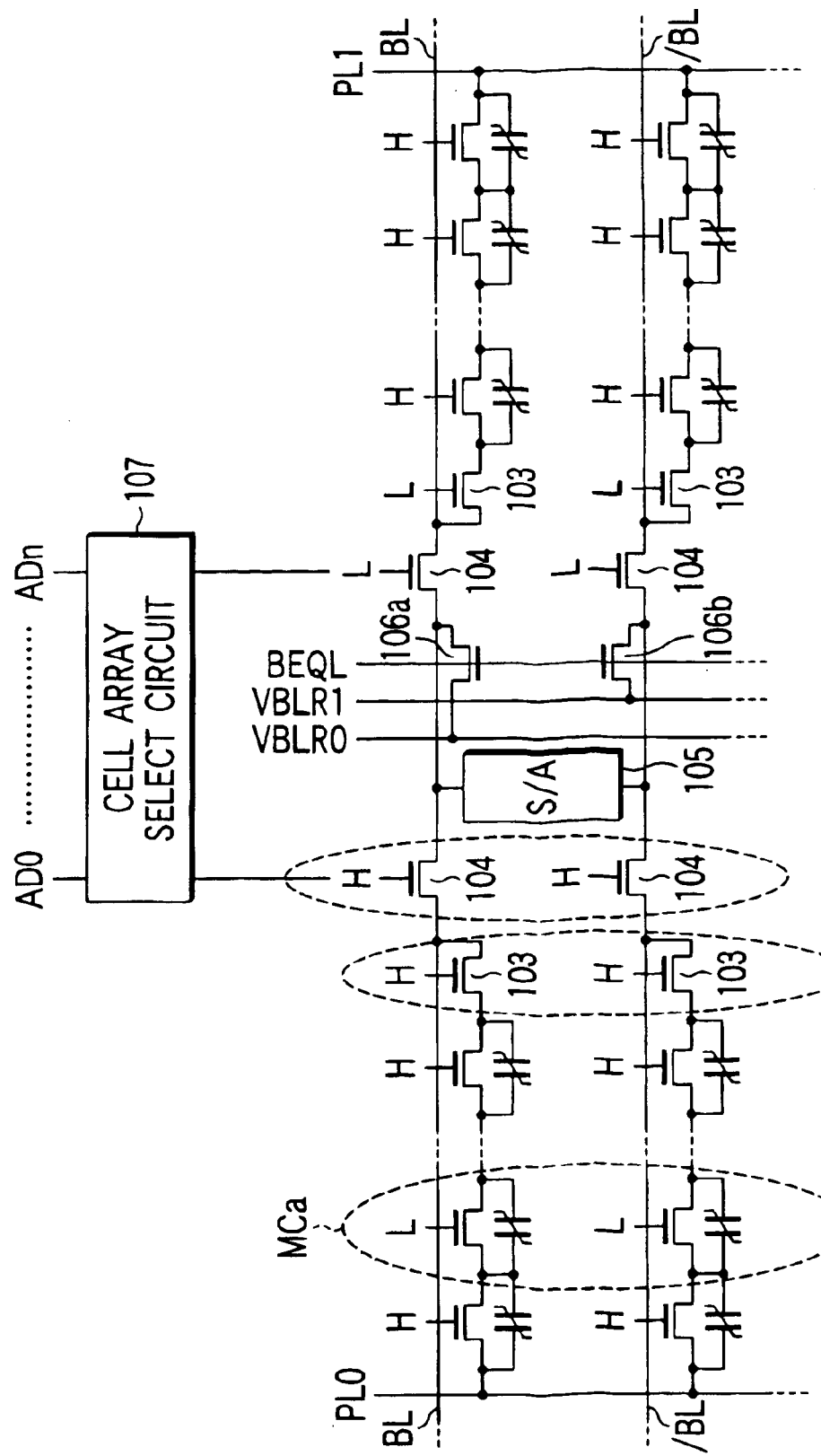
FIG. 12 is a circuit diagram for explaining an operation in a normal access in the FeRAM shown in FIG. 11.
Figure 14:
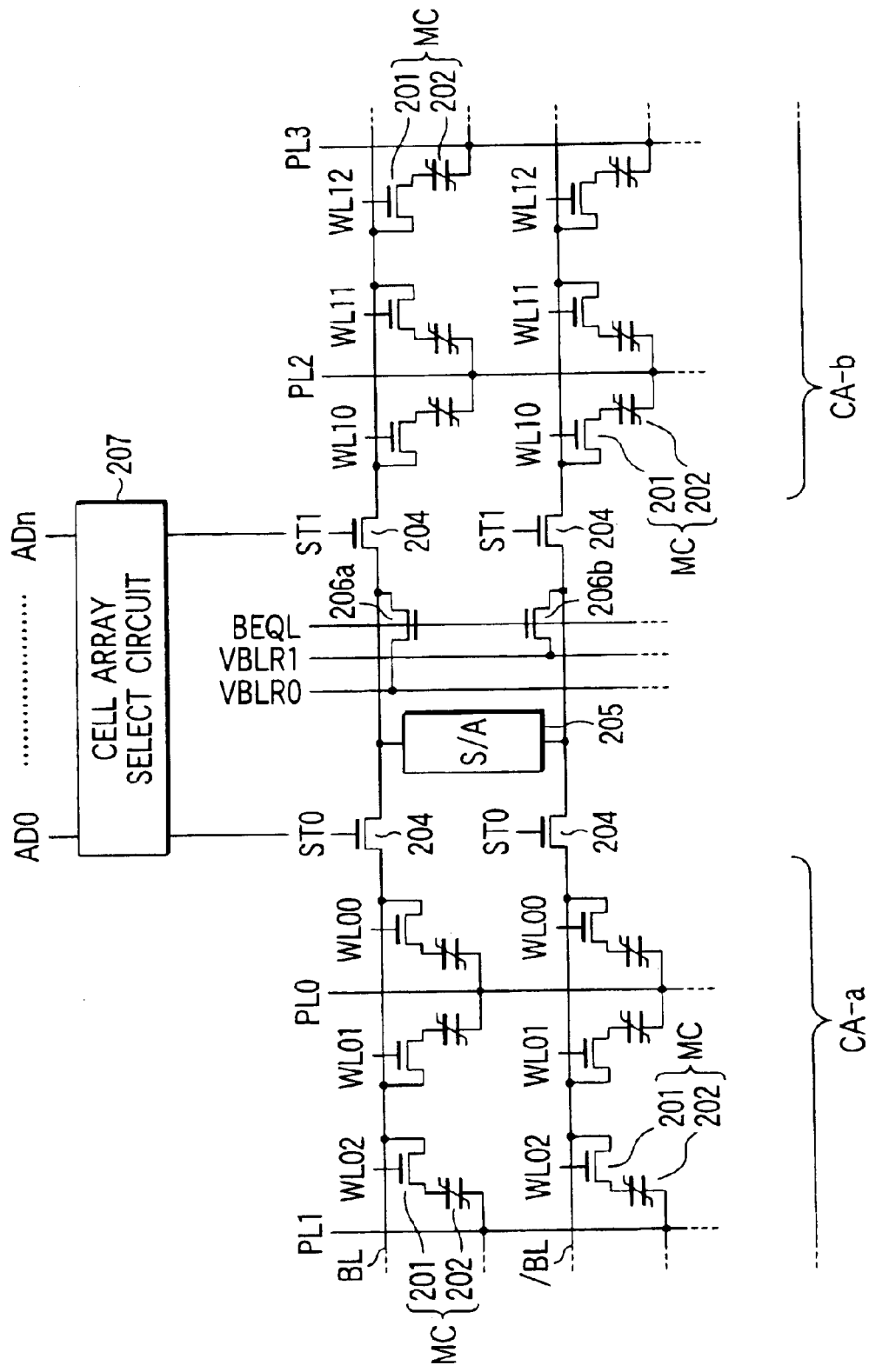
FIG. 14 is a circuit diagram showing another example of the structure of the conventional FeRAM.
Figure 15:
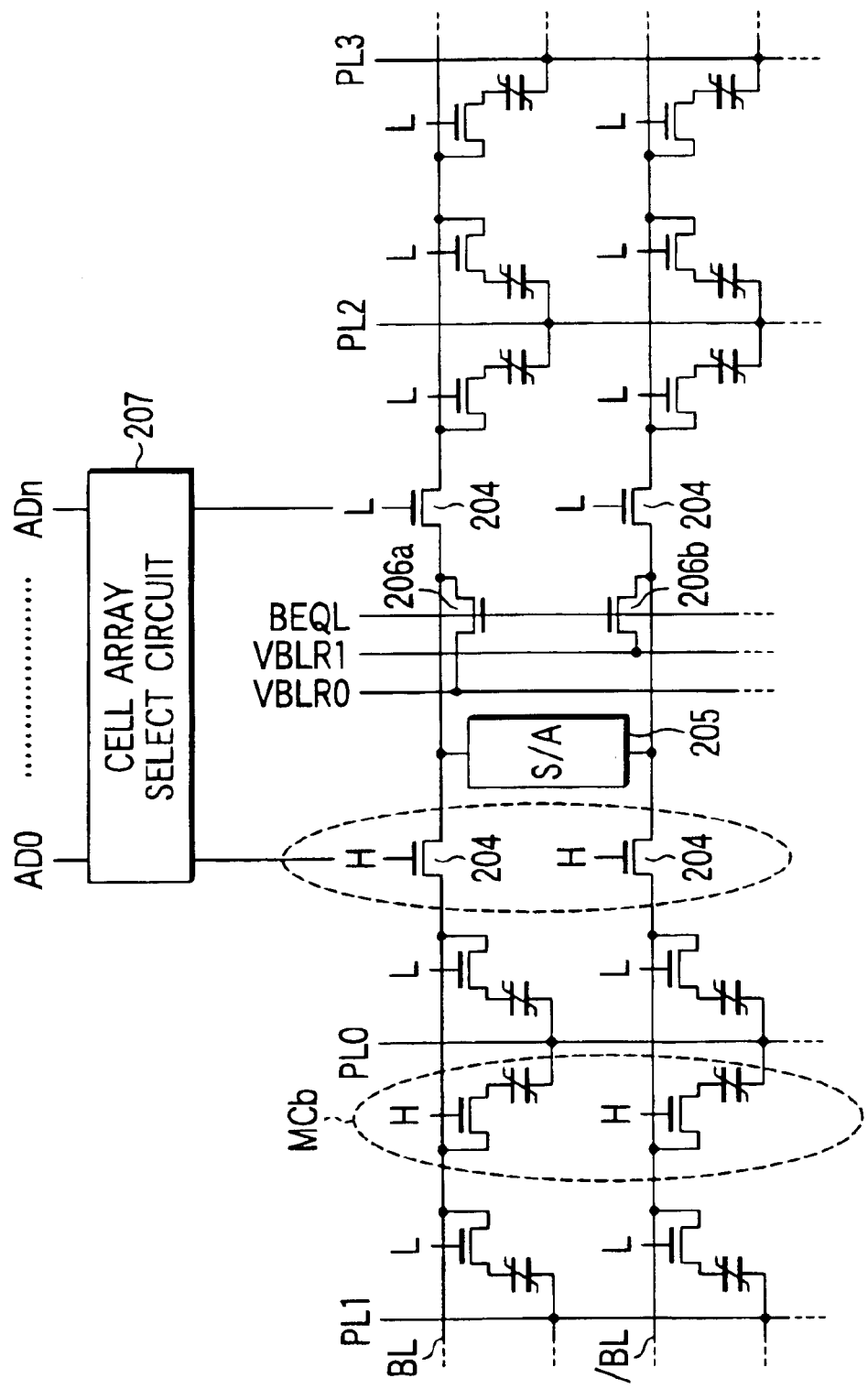
FIG. 15 is a circuit diagram for explaining the operation in a normal access in the FeRAM shown in FIG. 14.

In the above-described fourth embodiment, the potential of the plate line PLm (m=0, . . . ,k) and the potentials of the bit lines BL and /BL are alternately swung, thereby carrying out the desired test. Additionally, as shown in FIG. 10, the fatigue test can also be conducted by performing an operation similar to an ordinary read operation in the state in which the two cell arrays CA-a and CA-b connected to the sense amplifier 11 in the shared scheme are operated at the same time. Specifically, the test control signal FTG is set at the high level "H" and the potentials of both cell array select signal lines ST0 and ST1, which are outputs from the OR gates 15a and 15b, are set at the high level "H". In addition, the potential of the word line WL01, WL11 associated with the selected memory cells MCa is set at the high level "H". Thereby, the FeRAM is made to carry out the operation similar to the ordinary read operation in the state in which the cell arrays CA-a and CA-b are operated at the same time.

As has been described above, in the FeRAM with the structure shown in FIG. 9, the desired test can be conducted at the same time for the two simultaneously operating cell arrays CA-a and CA-b. Moreover, by causing the FeRAM to perform the operation similar to the ordinary read operation, the fatigue test with a reduced test time can be carried out.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a shared-scheme sense amplifier;
a bit line connected to the sense amplifier;
first and second select transistors arranged on both sides of the sense amplifier and connected to the bit line;
a first memory cell array connected to the bit line via the first select transistor, the first memory cell array including a plurality of memory cells each having a cell transistor and a ferroelectric capacitor;
a second memory cell array connected to the bit line via the second select transistor, the second memory cell array including a plurality of memory cells each having a cell transistor and a ferroelectric capacitor;
a setting circuit which controls the first and second select transistors, thereby setting the first and second memory cell arrays in an operative state at the same time; and
a control circuit which performs a test at the same time for the first and second memory cell arrays, which are set in the operative state at the same time by the setting circuit.

2. A semiconductor memory device according to claim 1, wherein the control circuit controls, during a fatigue test, a potential difference between the ferroelectric capacitors included in memory cells to be tested of the plurality of memory cells.

3. A semiconductor memory device according to claim 1, wherein the bit line comprises a signal line pair.

4. A semiconductor memory device according to claim 1, wherein a word line is connected to a gate terminal of each cell transistor.

5. A semiconductor memory device according to claim 1, wherein each of the first and second memory cell arrays includes a plurality of memory blocks, each of the plurality of memory blocks being formed by connecting a predetermined number of the plurality of memory cells in series, one terminal of each of the plurality of memory blocks being connected to the bit line via a block select transistor, and the other terminal of each of the plurality of memory blocks being connected to a plate line.

6. A semiconductor memory device according to claim 5, wherein each of the plurality of memory cells is configured such that a ferroelectric capacitor is connected in parallel between a source and a drain of the cell transistor.

7. A semiconductor memory device according to claim 1, wherein each of the first and second memory cell arrays includes the plurality of memory cells, each of which is configured such that one end of a ferroelectric capacitor is connected in series to one of a source terminal and a drain terminal of the cell transistor.

8. A semiconductor memory device according to claim 7, wherein each of the plurality of memory cells is configured such that the other of the source and drain terminals of the cell transistor is connected to the bit line, and the other end of the ferroelectric capacitor is connected to a plate line.

9. A method of testing a semiconductor memory device including:
first and second select transistors arranged on both sides of a shared-scheme sense amplifier and connected to a bit line;
a first memory cell array connected to the bit line via the first select transistor, the first memory cell array including a plurality of memory cells each having a cell transistor and a ferroelectric capacitor;
a second memory cell array connected to the bit line via the second select transistor, the second memory cell array including a plurality of memory cells each having a cell transistor and a ferroelectric capacitor,
the method comprising:
controlling the first and second select transistors by a setting circuit, thereby setting the first and second memory cell arrays in an operative state at the same time; and
performing a test at the same time, by a control circuit, for the first and second memory cell arrays, which are set in the operative state at the same time by the setting circuit.

10. A method of testing a semiconductor memory device according to claim 9, wherein the control circuit controls, during a fatigue test, a potential difference between the ferroelectric capacitors included in memory cells to be tested of the plurality of memory cells.

11. A method of testing a semiconductor memory device according to claim 9, wherein each of the first and second memory cell arrays includes a plurality of memory blocks, each of the plurality of memory blocks being formed by connecting a predetermined number of the plurality of memory cells in series, one terminal of each of the plurality of memory blocks being connected to the bit line via a block select transistor, the other terminal of each of the plurality of memory blocks being connected to a plate line, each of the plurality of memory cells being configured such that a ferroelectric capacitor is connected in parallel between a source and a drain of the cell transistor, and a word line being connected to a gate terminal of each cell transistor,
wherein during a fatigue test the control circuit alternately changes the potential of the bit line and the potential of the plate line in a state in which the word line associated with memory cells to be tested of the plurality of memory cells is selected and all the block select transistors are selected.

12. A method of testing a semiconductor memory device according to claim 11, wherein the control circuit controls the potential of the bit line by setting a first control transistor connected to the bit line in a conductive state, and by applying a pulse signal to a source of the first control transistor.

13. A method of testing a semiconductor memory device according to claim 11, wherein the control circuit controls the potential of the bit line by raising the potential of the bit line up to a power supply potential using a second control transistor connected to the bit line, and by lowering the potential of the bit line to a ground potential using a third control transistor connected to the bit line.

14. A method of testing a semiconductor memory device according to claim 9, wherein each of the first and second memory cell arrays includes a plurality of memory blocks, each of the plurality of memory blocks being formed by connecting a predetermined number of the plurality of memory cells in series, one terminal of each of the plurality of memory blocks being connected to the bit line via a block select transistor, the other terminal of each of the plurality of memory blocks being connected to a plate line, each of the plurality of memory cells being configured such that the ferroelectric capacitor is connected in parallel between a source and a drain of the cell transistor, and a word line being connected to a gate terminal of each cell transistor, wherein during a fatigue test, a read operation for memory cells to be tested of the plurality of memory cells is executed in a state in which the word line and the block select transistors associated to the memory cells to be tested are selected.

15. A method of testing a semiconductor memory device according to claim 9, wherein each of the first and second memory cell arrays includes the plurality of memory cells, each of which is configured such that one end of a ferroelectric capacitor is connected to one of a source terminal and a drain terminal of the cell transistor, each of the plurality of memory cells is configured such that the other of the source and drain terminals of the cell transistor is connected to the bit line and the other end of the ferroelectric capacitor is connected to a plate line, and a word line is connected to a gate terminal of each cell transistor, wherein during a fatigue test the control circuit alternately changes the potential of the bit line and the potential of the plate line in a state in which all the word lines are selected.

16. A method of testing a semiconductor memory device according to claim 15, wherein the control circuit controls the potential of the bit line by setting a first control transistor connected to the bit line in a conductive state, and by applying a pulse signal to a source of the first control transistor.

17. A method of testing a semiconductor memory device according to claim 15, wherein the control circuit controls the potential of the bit line by raising the potential of the bit line up to a power supply potential using a second control transistor connected to the bit line, and by lowering the potential of the bit line to a ground potential using a third control transistor connected to the bit line.

18. A method of testing a semiconductor memory device according to claim 9, wherein each of the first and second memory cell arrays includes the plurality of memory cells, each of which is configured such that one end of a ferroelectric capacitor is connected to one of a source terminal and a drain terminal of the cell transistor, each of the plurality of memory cells is configured such that the other of the source and drain terminals of the cell transistor is connected to the bit line and the other end of the ferroelectric capacitor is connected to a plate line, and a word line is connected to a gate terminal of each cell transistor, wherein during a fatigue test a read operation for memory cells to be tested of the plurality of memory cells is executed in a state in which the word line associated to the memory cells to be tested is selected.

* * * * *